Nov. 5, 1957    D. W. VAN DER SIJDE ET AL    2,812,434

PLURAL BAND SUPERHETERODYNE RECEIVER WITH IMPROVED TRACKING

Filed July 23, 1953

INVENTORS
DIRK WILLEM VAN DER SYDE
PIETER ZIJP
BY [signature]
AGENT 2,812,434

PLURAL BAND SUPERHETERODYNE RECEIVER WITH IMPROVED TRACKING

Dirk Willem van der Sijde and Pieter Zijp, Eindhoven, Netherlands, assignors, by mesne assignments, to North American Philips Company, Inc., New York, N. Y., a corporation of Delaware Application July 23, 1953, Serial No. 369,844

Claims priority, application Netherlands August 26, 1952

2 Claims. (Cl. 250—20)

Figure 1:
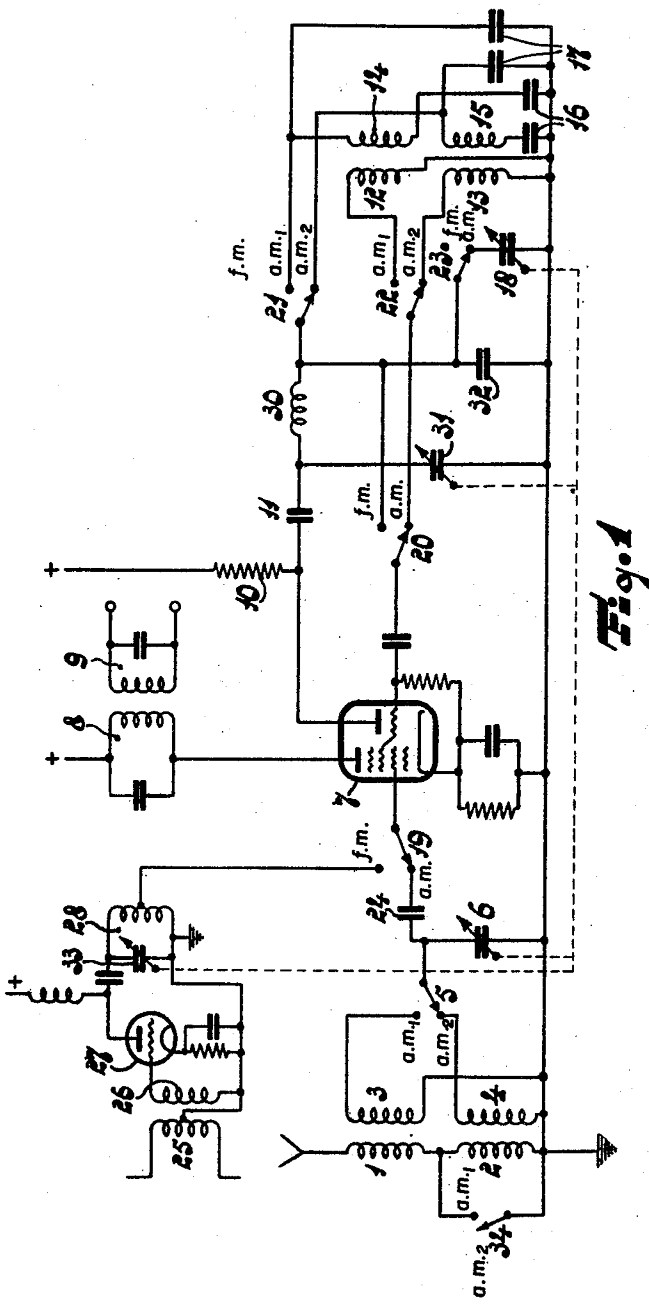

This invention relates to superheterodyne receivers for the reception of stations located in a plurality of wave-length ranges, for example a long-wave range, a medium-wave range and a short-wave range. It is common practice in this case to utilize a single tuning capacitor in each circuit for the tuning in all these ranges, the capacitors of the various circuits being mechanically coupled, so that they can be operated by a single knob, provision being made of a switch for wave-length changing by which the inductors associated with the high-frequency circuit or circuits and the oscillator circuit are replaced by other ones upon passing from one range to another.

A problem always involved thereby is to retain in each range a constant difference between the resonance frequency of the high-frequency circuit or circuits and the oscillator circuit.

This may be ensured for a single range by choosing the capacitors of the high-frequency circuit and the oscillator circuit with different frequency characteristic curves. If, as is common practice, the oscillator frequency is chosen to be higher than the frequency of the incoming oscillations, this commonly implies that the maximum and the minimum capacities of the tuning capacitor of the oscillator circuit are smaller than the corresponding capacities of the capacitors of the high-frequency circuits. When changing-over to another frequency range by replacing the inductors of the circuits by other ones, the said difference is not retained, however, so that this method cannot be used in practice for receivers having a plurality of wavelength ranges.

In the case of reception for a plurality of wavelength ranges, it is common practice to include fixed capacitors in the oscillator circuit, one of which is commonly connected in series with the tuning capacitor and the other in parallel therewith. As a rule, the proportioning is such that the correct frequency difference between the resonance frequency of the oscillator circuit and that of the high-frequency circuit or circuits is obtained at the ends of the tuning range and at a point located therebetween. A certain deviation still occurs for other frequencies.

The object of the invention is to provide an improvement in such a circuit, which may be realized in a particularly simple manner.

According to the invention, in a superheterodyne receiver adapted for the reception of stations in a plurality of wavelength ranges in which a single variable capacitor in each tunable circuit serves for tuning in all ranges and in which, furthermore, means are provided by which the difference between the resonance frequency of the preceding circuits and that of the oscillator circuits is maintained substantially constant for tuning in each range, which means are constituted by fixed series- and parallel-capacitors included in the oscillator circuit, the maximum capacity of the tuning capacitor for the oscillator circuit being higher than that of the tuning capacitor of the preceding high-frequency circuit or circuits.

This may be ensured by connecting in parallel with the tuning capacitor of the oscillator circuit a second variable capacitor, the rotary plates of which are provided on the same shaft as the plates of the variable capacitors of the preceding circuits and of the oscillator circuit. The last-mentioned capacitors may be identical, whereas the second variable capacitor may have a capacity materially lower than that of the others. A particularly simple embodiment of the invention is obtained for receivers in which for a determined wave-length range use is made of particular variable capacitors having capacities which are lower than those of the tuning capacitors for the other ranges. This occurs in receivers adapted for the reception of very high frequencies such as used in transmitters for frequency-modulated oscillations. The rotors of all tuning capacitors are provided, as before on a common shaft.

It has been found that the resulting capacitances of the tuning capacitors is such that in all wave-length ranges a substantially constant difference between the oscillator frequency and the natural frequency of the preceding circuits occurs for tuning to frequencies in the range concerned.

A variable capacitor is not connected in parallel with the tuning capacitors of the preceding circuits. Such a device has the additional advantage that the wave-length switch may be simpler in construction.

The group of tuning capacitors comprises a rotary part which, when use is made of a single high-frequency preceding circuit, is constituted by two identical assemblies which are comparatively large and two identical assemblies which are comparatively small.

Figure 2:

In order that the invention may be readily carried into effect, it will now be described with reference to the accompanying drawing, given by way of example, in which:

Fig. 1 is a schematic electrical diagram of a preferred embodiment of the invention; and Fig. 2 is an elevational view of a preferred arrangement of tuning condensers used in the embodiment of Fig. 1.

Fig. 1 shows a receiver in which it is assumed, by way of example, that reception in three wave-length ranges is possible, one of them being a range of frequency-modulated transmission. This will naturally be the range of the highest frequencies, for example frequencies of the order of magnitude of 100 mc./s. The other ranges may be the long-wave range and the medium-wave range or the medium-wave range and a short-wave range.

The circuit diagram according to the invention comprises an aerial circuit including two aerial coils 1 and 2, the second of which is short-circuited by a switch 34 for reception of the shorter waves, for example the medium waves. It is assumed that the positions of the various switches are such that the receiver is adapted for reception of the longer waves. The short-wave coil 1 and the long-wave coil 2 are inductively coupled to coils 3 and 4, respectively, which coils are associated with a tunable high-frequency circuit, in which by means of a switch 5 either coil 3, or coil 4 may be connected in parallel with the tuning capacitor 6 of the first high-frequency circuit. A switch 19 permits of switching the high-frequency circuit between the control-grid and the cathode of a hexode system which serves for mixing. The hexode system, together with a triode system which serves to produce the local oscillations, constitutes a triode-hexode tube 7. The anode of the hexode portion is connected to the positive terminal of a source of supply voltage by way of a circuit 8 tuned to the intermediate frequency. The circuit 8, together with a circuit 9 which is likewise tuned to the intermediate frequency, constitutes an intermediate-frequency band-pass filter. The intermediate-frequency oscillations are derived from circuit 9 to be further amplified and detected.

The anode of the triode portion of tube 7 is fed operating current by way of a resistor 10 and is connected by way of a capacitor 11, an inductor 30, the function of which will be described hereinafter, and a switch 21 to a tuning coil 15, which serves as the oscillator coil for reception of the low frequencies. A coil 14 is switched-in, by way of the switch 21, for reception of the higher frequencies. The control grid of the triode part is connected, on the one hand, by way of a resistor to the cathode of the tube 7 and, on the other hand, by way of a capacitor and a switch 20 to a feedback coil 13, which is coupled to the coil 15. By operation a switch 22, the inductor 13 is replaced by an inductor 12, which is coupled to the inductor 14. The oscillator circuit is tuned with the aid of a capacitor 18, which is switched-in with the aid of a switch 23. 16 and 17 indicate the usual padding capacitors. The circuit so far described is of the conventional kind.

The circuit of the invention permits the reception of a range of even higher frequency-modulated oscillations. For this purpose an FM aerial 25 is provided, which is coupled to an input inductor 26 of a tube 27. The frequency-modulated oscillations are amplified therein. When the switch 19 occupies its upper position, the amplified oscillations occurring in a circuit 28 which is tunable by means of a capacitor 33 are supplied to the first control grid of the hexode part of tube 7. The tuning capacitor 33 has a maximum capacity which is much smaller than that of the capacitors 6 and 18. For reception of this range of oscillations the switch 20 is likewise operated and the switches 21 and 23 are made fully inoperative, i. e., are disconnected from the elements 14, 15, 17, and 18. The anode circuit of the triode portion of the tube 7 then comprises the circuit 30, 31, 32, which is tunable by means of the capacitor 31 and which is provided in three-point connection between the electrodes of the triode, so that oscillations of high frequency occur therein and are mixed in the hexode portion with the incoming oscillations, thus producing oscillations of intermediate frequency which, if desired, differ in frequency from the intermediate-frequency oscillations for the other wave-length ranges. The capacitor 31 may be identical with the capacitor 33 and also the capacitors 6 and 18 may have equal values. The four capacitors are mounted on a single shaft. If desired, the capacitor 32 may be switched out for reception of the longer-wave ranges.

In the circuit described the tuning synchronism of the preceding circuit, viz. the circuit connected to the input signal grid of tube 7, and the oscillator circuit in each range of lower frequency may be considerably improved over the prior known systems. This is ensured due to the capacitor 31 invariably being connected in parallel to the tuning capacitor 18 for reception in the range concerned. The inductor 30 is so small that it does not in this case exert any appreciable influence. The capacitor 33 is fully inoperative in the reception of lower frequency ranges. Consequently, the total capacity of the oscillator circuit is higher than that of the preceding circuit, but by correct proportioning of the various padding capacitors it is nevertheless possible to ensure that the oscillator frequency is higher than the incoming frequency, the difference between them being, to a large approximation, equal to the intermediate frequency for the whole tuning range.

Fig. 2 shows a group of capacitors such as preferably is used in the circuit shown in Fig. 1. All rotors are provided on a single rotary shaft 35.

It is evident that the various switches may be combined to form a single switching member having a plurality of positions dependent upon the number of the frequency ranges to be received, which switching member may be operated by a single knob.

What is claimed is:

1. A multi-band superheterodyne receiver for receiving signals in a relatively high-frequency band and in a relatively low-frequency band, comprising a signal mixing stage having a radio signal input terminal and a local oscillaiton input terminal, an input circuit arrangement comprising a first input circuit tunable in said high-frequency band and a second input circuit tunable in said low-frequency band, a local oscillator circuit connected to said local oscillation input terminal and comprising an electron discharge device having a cathode, an anode and a control electrode, a first coil and a first capacitor permanently connected electrically in series between said cathode and said anode, a first variable capacitor permanently connected electrically between said cathode and said anode and having a value of capacitance to form a resonant circuit with said first coil which is tunable over a range of frequencies in said high frequency band, a second coil having feedback means associated therewith, a second variable capacitor having a value of capacitance to form a resonant circuit with said second coil which is tunable over a range of frequencies in said low-frequency band, means connected to vary the capacitances of said variable capacitors simultaneously and in the same sense, means for adapting said receiver to receive signals in said high-frequency band comprising means to connect said first input circuit to said signal input terminal and means to connect said control electrode to the junction of said first coil and said first capacitor, and means for adapting said receiver to receive signals in said low-frequency band comprising means to connect said second input circuit to said signal input terminal, means to connect said second coil and said second variable capacitor electrically in parallel between said anode and said cathode, and means to connect said feedback means to said control electrode.

2. A multi-band oscillator circuit comprising an electron discharge device having a cathode, an anode and a control electrode, a first coil and a first capacitor permanently connected electrically in series between said cathode and said anode, a first variable capacitor permanently connected electrically between said cathode and said anode and having a value of capacitance to form a resonant circuit with said first coil which is tunable over a range of relatively high frequencies, a second coil having feedback means associated therewith, a second variable capacitor having a value of capacitance to form a resonant circuit with said second coil which is tunable over a range of relatively low frequencies, means connected to vary the capacitances of said variable capacitors simultaneously and in the same sense, means for adapting said oscillator circuit to oscillate in said high-frequency range comprising means to connect said control electrode to the junction of said first coil and said first capacitor, and means for adapting said oscillator circuit to oscillate in said low-frequency range comprising means to connect said second coil and said second variable capacitor electrically in parallel between said anode and said cathode, and means to connect said feedback means to said control electrode.

References Cited in the file of this patent

UNITED STATES PATENTS

| | | |
|---|---|---|
| 1,949,843 | Roberts | Mar. 6, 1934 |
| 2,072,365 | Grimes | Mar. 2, 1937 |
| 2,355,470 | Root | Aug. 8, 1944 |
| 2,443,935 | Shea | June 22, 1948 |
| 2,477,391 | Reid et al. | July 26, 1949 |
| 2,510,002 | Van Loon et al. | May 30, 1950 |
| 2,536,331 | Van Loon et al. | Jan. 2, 1951 |
| 2,561,087 | Anderson | July 17, 1951 |